US012673294B2

(12) United States Patent
Tsao

(10) Patent No.: US 12,673,294 B2
(45) Date of Patent: Jul. 7, 2026

(54) TOOL EXHAUST SYSTEM AND TREATMENT METHOD

(71) Applicant: Taiwan Semiconductor Manufacturing Co., Ltd., Hsinchu (TW)

(72) Inventor: Chih-Ming Tsao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 875 days.

(21) Appl. No.: 17/745,585

(22) Filed: May 16, 2022

(65) Prior Publication Data

US 2023/0364550 A1 Nov. 16, 2023

(51) Int. Cl.
*B01D 53/14* (2006.01)
*B01D 53/18* (2006.01)
*H10P 72/00* (2026.01)

(52) U.S. Cl.
CPC ..... *B01D 53/1487* (2013.01); *B01D 53/1456* (2013.01); *B01D 53/18* (2013.01); *H10P 72/0402* (2026.01)

(58) Field of Classification Search
CPC ............ B01D 53/1487; B01D 53/1456; B01D 53/18; H01L 21/67017
See application file for complete search history.

(56) References Cited

U.S. PATENT DOCUMENTS

| | | | | |
|---|---|---|---|---|
| 6,821,317 | B2 * | 11/2004 | Echizen | B01D 53/1406 95/224 |
| 7,329,308 | B2 * | 2/2008 | Goodwin | B01D 47/14 95/149 |
| 8,512,448 | B2 * | 8/2013 | Sonnek | B01D 53/1487 423/220 |
| 11,504,670 | B2 * | 11/2022 | Mauch | B01D 47/06 |
| 2002/0046652 | A1 * | 4/2002 | Lindsay | B01D 53/1487 96/266 |
| 2003/0094099 | A1 * | 5/2003 | Lin | B01D 53/1425 95/149 |
| 2005/0081715 | A1 | 4/2005 | Goodwin et al. | |
| 2005/0132883 | A1 * | 6/2005 | Su | C10K 3/04 423/220 |

(Continued)

FOREIGN PATENT DOCUMENTS

| | | |
|---|---|---|
| CN | 109821377 A | 5/2019 |
| CN | 113993610 A | 1/2022 |

(Continued)

*Primary Examiner* — Binh X Tran
*Assistant Examiner* — Christopher Remavege
(74) *Attorney, Agent, or Firm* — Seed Intellectual Property Law Group LLP

(57) ABSTRACT

Systems and methods for removing impurities from exhaust gases produced by semiconductor processing tools, e.g., such as a wet bench, utilize cooled scrubbing fluids and non-random structured packing materials to achieve and enhance removal of acid or alkaline components in the exhaust gas along with an enhanced removal of volatile organic components in the exhaust gas. Removal efficiencies of the acid or alkaline components of greater than 90% and removal efficiencies of the volatile organic components of greater than 70% are described.

20 Claims, 6 Drawing Sheets

(56) References Cited

U.S. PATENT DOCUMENTS

| 2006/0185517 | A1* | 8/2006 | Nagel | ................. | B01D 53/1406 |
| | | | | | 96/275 |
| 2014/0065040 | A1* | 3/2014 | Katz | ................. | B01D 53/1456 |
| | | | | | 423/210 |
| 2014/0242680 | A1* | 8/2014 | Wong | .................... | B01D 53/72 |
| | | | | | 423/245.1 |
| 2020/0139301 | A1* | 5/2020 | Mauch | ................... | B01D 47/12 |
| 2021/0276886 | A1* | 9/2021 | Parthasarathy | .... | B01D 53/1493 |
| 2021/0387129 | A1* | 12/2021 | Krönlein | .............. | B01D 47/027 |
| 2021/0403822 | A1* | 12/2021 | Gubrinski | .......... | B01D 53/1487 |

FOREIGN PATENT DOCUMENTS

| KR | 10-2017-0032739 A | 3/2017 |
| TW | 492891 B | 7/2002 |
| TW | 1708635 B | 11/2020 |

* cited by examiner

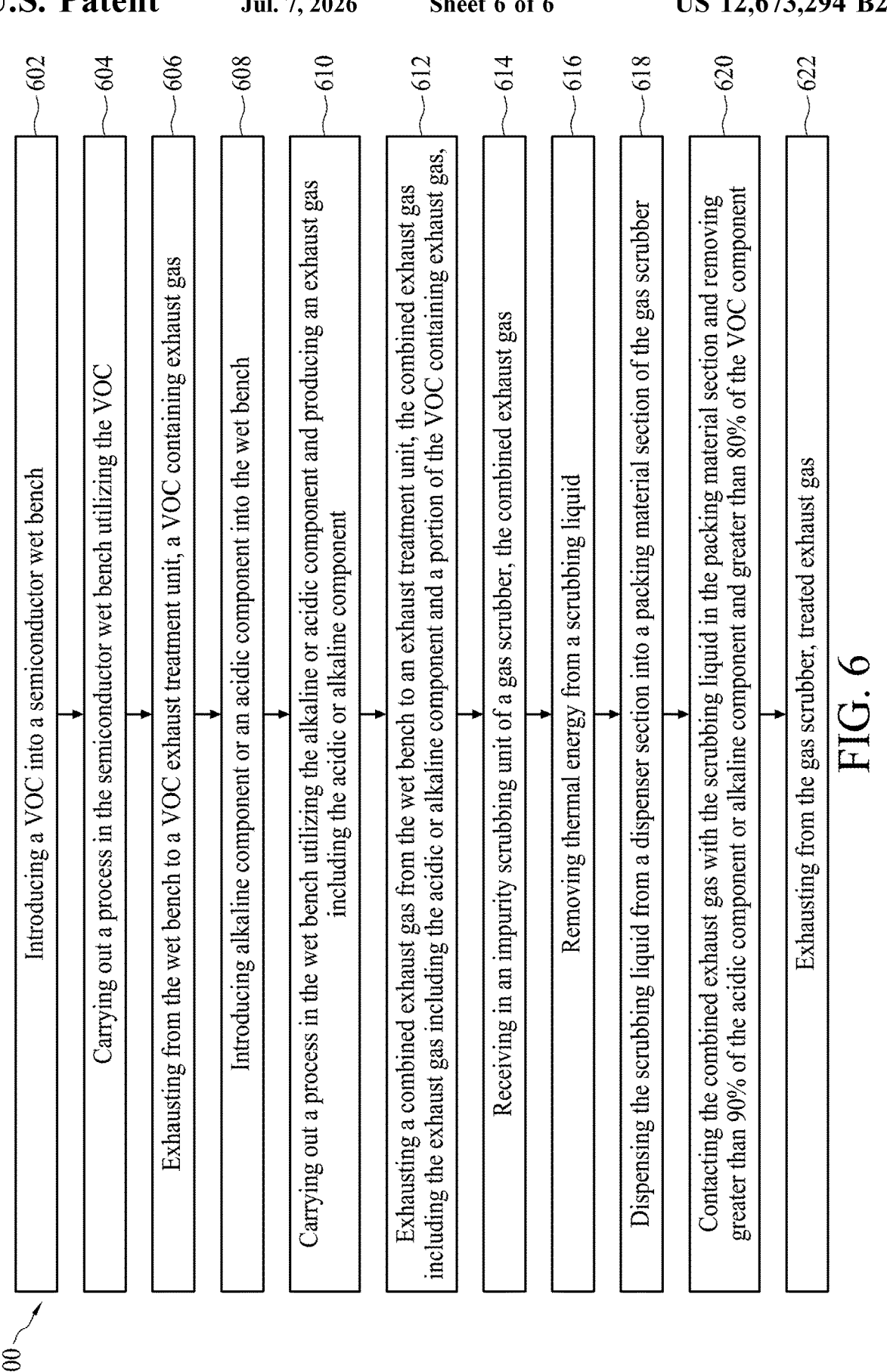

602 — Introducing a VOC into a semiconductor wet bench

604 — Carrying out a process in the semiconductor wet bench utilizing the VOC

606 — Exhausting from the wet bench to a VOC exhaust treatment unit, a VOC containing exhaust gas 608 — Introducing alkaline component or an acidic component into the wet bench 610 — Carrying out a process in the wet bench utilizing the alkaline or acidic component and producing an exhaust gas including the acidic or alkaline component 612 — Exhausting a combined exhaust gas from the wet bench to an exhaust treatment unit, the combined exhaust gas including the exhaust gas including the acidic or alkaline component and a portion of the VOC containing exhaust gas, 614 — Receiving in an impurity scrubbing unit of a gas scrubber, the combined exhaust gas 616 — Removing thermal energy from a scrubbing liquid 618 — Dispensing the scrubbing liquid from a dispenser section into a packing material section of the gas scrubber 620 — Contacting the combined exhaust gas with the scrubbing liquid in the packing material section and removing greater than 90% of the acidic component or alkaline component and greater than 80% of the VOC component 622 — Exhausting from the gas scrubber, treated exhaust gas

TOOL EXHAUST SYSTEM AND TREATMENT METHOD

BACKGROUND

When it comes to cleaning wafers in the semiconductor industry, wet benches are used in which carrier boxes containing several wafers are immersed into liquid baths arranged one after the other. The exhaust air or gas of each liquid bath is fed into an exhaust gas system. In such systems, a distinction may be made between exhaust gas containing acidic compounds, alkaline compounds, volatile organic compounds (VOC) and general exhaust gas or air.

Single wafer wet cleaning systems consist of several process chambers that allow several wafers to be treated separately at the same time or that allow various process steps to be carried out in order to clean individual wafers in different chambers. During the cleaning process, the wafers are sprayed one after the other with various liquid chemicals that are then removed by spinning the wafers. Aside from ultrapure water, other typical washing liquids include ammonia solution, sulfuric acid, hydrogen peroxide, ozone-treated water, hydrofluoric acid or isopropanol. During the spraying and spinning of the wafers, the liquid either evaporates or ends up in the exhaust air channel in the form of small droplets or vapor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow diagram of a process for treating exhaust gas from a semiconductor tool, in accordance with some embodiments.

DETAILED DESCRIPTION

Figure 1:
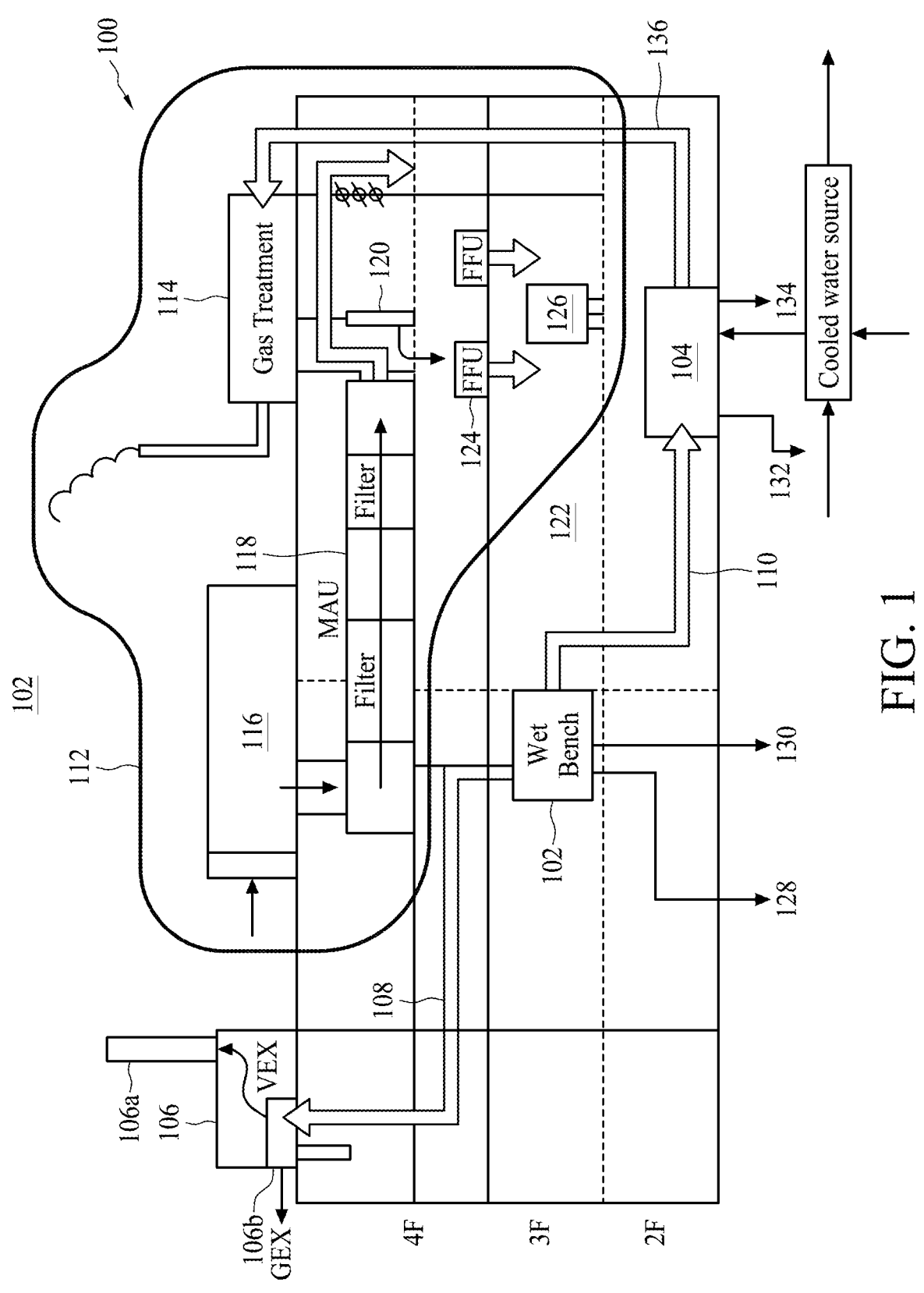
FIG. 1 is a schematic illustration of a semiconductor processing facility, including a system for treating exhaust gas from a semiconductor tool, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments described herein relate to systems and methods for removing acidic, alkaline and/or volatile organic materials from exhaust gases produced in a tool in which semiconductor processes are carried out. Embodiments in accordance with the present disclosure are described with reference to exhaust gases produced in a wet bench of a semiconductor fabrication facility; however, embodiments of the present disclosure are not limited to systems and methods for removing acidic, alkaline and/or volatile organic materials from wet bench exhaust gases. For example, systems and methods for removing acidic, alkaline and/or volatile organic materials from exhaust gases described herein may be utilized to remove such materials from exhaust gases of other tools in which other semiconductor processes are carried out, e.g., lithography, etching, deposition, cleaning, or surface modification processes. Embodiments of systems in accordance with the present disclosure include a cooling module for reducing the temperature of a fluid, e.g., a liquid that will be contacted with an exhaust gas to remove unwanted materials from the exhaust gas, especially volatile organic components in the exhaust gas. In some embodiments, the contact of the exhaust gas and the liquid is carried out in a bed of non-random structured packing material that has a surface area to volume ratio greater than the surface area to volume ratio of random packing materials. Methods described herein utilize the systems of the disclosed embodiments.

In the manufacture of semiconductor devices many process steps emit harmful waste gases or utilize liquids that may volatilize and form harmful waste gases. For example, chemical vapor deposition or dry etching utilizes very reactive gases. Wet chemical processes can also utilize and produce reactive and volatile gases. In some wet benches, multiple wafers are submerged into a sequence of liquid baths, where each compartment of the wet bench contains the same type of liquid. The ventilated air or inert gas from each compartment is directed into one of several exhaust systems. This ventilated exhaust gas can typically be classified as acidic exhaust, alkaline exhaust, VOC exhaust and general exhaust. In other wet bench tools, single wafers are loaded in a process chamber. A wet-clean tool has multiple process chambers to process several wafers at one time or to perform different process steps in different chambers. At the time of cleaning, the wafers are sprayed with different liquid chemicals in a sequence, which may then be removed by spinning the wafer. Besides pure water, typical liquid chemicals used in a wet bench include ammonia, sulphuric acid, hydrogen peroxide, ozonized water, hydrofluoric acid or isopropyl alcohol. During the spraying and spinning some liquid evaporates and small liquid droplets can be sucked into the ventilation ducts and need to be processed by the exhaust treatment system so that the evaporated liquids do not remain in gases that are exhausted to the environment or that are exhausted within the semiconductor processing facility.

Generally, wet-scrubbers are utilized to remove soluble gases from a gas flow. Acidic and basic gases (e.g., hydrofluoric or sulfuric acid and ammonia) can be reduced to low levels by chemical absorption with alkaline or acidic scrubbing liquid (see Equations 2 and 3 below). For solvents that follow Henry's Law the lowest possible exhaust concentration post scrubber is limited by the effective concentration in the scrubbing liquid of the final scrubber stage (see Equation 4).

$$HF+OH^-\leftrightarrow F^-+H_2O \qquad \text{(Equation 2)}$$

$$NH_3+H_3O+\leftrightarrow NH_4+H_2O \qquad \text{(Equation 3)}$$

$$kH=p/c_{aq} \qquad \text{(Equation 4)}$$

where $c_{aq}$ is the concentration in the liquid phase, and p is the partial pressure in the gas phase.

Referring to FIG. 1, a semiconductor fabrication facility exhaust gas treatment system 100 in accordance with embodiments of the present disclosure is schematically illustrated within a semiconductor fabrication facility. In the illustrated portion of a semiconductor fabrication facility, three floors 2F-4F are illustrated. It is understood that not all systems or tools present in the semiconductor fabrication facility are illustrated in FIG. 1. In FIG. 1, the semiconductor fabrication facility includes a wet bench or other process tool 102 in fluid communication with a combined exhaust gas treatment unit 104. In accordance with some embodiments, combined exhaust gas treatment unit 104 is a gas scrubber, e.g., a wet gas scrubber. Details of combined exhaust gas treatment unit 104 are provided below. Embodiments of the present disclosure are described below in the context of a process tool 102 being a wet bench; however, embodiments in accordance with the present disclosure are not limited to process tool 102 being a wet bench. For example, process tool 102 can be a process tool other than a wet bench that produces exhaust gases including acidic, alkaline and/or VOC components that are desirably removed from the exhaust gases before the exhaust gases are dispensed into the environment or into the general environment of the fabrication facility. In the embodiment of FIG. 1, wet bench 102 includes an outlet in fluid communication with line 108. Line 108 is in fluid communication with a combined general exhaust (GEX)/VOC exhaust (VEX) treatment system 106 located on the top of floor 4F. Line 108 serves to deliver exhaust gases from the wet bench 102 to the combined general exhaust (GEX)/VOC exhaust (VEX) treatment system 106. Wet bench 102 also includes outlets 128 and 130 for removing various fluids in liquid form from the wet bench 102.

Combined GEX/VEX treatment system 106 includes a VEX treatment unit 106a and a GEX treatment unit 106b. The combined GEX/VEX treatment unit 106 includes a gas diverter or flow guide damper capable of directing exhaust gas from line 108 to either the GEX treatment unit 106b or the VEX treatment unit 106a depending on the composition of the exhaust gas in line 108. For example, when the gas in exhaust line 108 is primarily VOC, the exhaust gas is directed to VEX treatment unit 106a, e.g., a thermal oxidizer which thermally oxidized the VOC. If the gas in the exhaust line 108 is primarily gas that can be exhausted to the environment or the general environment of the fabrication facility, the exhaust gas is directed to the GEX treatment unit and either treated to remove unwanted components or exhausted without further treatment.

In the embodiment of FIG. 1, wet bench 102 also includes a second outlet in fluid communication with line 110. One end of line 110 is in fluid communication with the second outlet of the wet bench 102 and the other end of line 110 is connected to the combined exhaust gas treatment unit 104. Line 110 provides a conduit through which exhaust gas from wet bench 102 flows to combined exhaust gas treatment unit 104. Wet bench 102 includes a switch box damper or other device (not shown), which in operation, directs exhaust gases to either line 108 or line 110 while blocking exhaust gases from entering the other line. In addition to being in fluid communication with wet bench 102, combined exhaust gas treatment unit 104 is in fluid communication with components of a system exhaust gas treatment system 112 via line 136. Combined exhaust gas treatment unit 104 includes outlets 132 and 134, through which liquids, such as acid, alkaline, VOC or scrubbing liquids are removed from combined exhaust gas treatment unit 104. Further details of combined exhaust gas treatment unit 104 are provided below.

System gas treatment system 112 includes a plurality of additional components, including a system exhaust gas treatment unit (SEX) 114 in fluid communication with the combined exhaust gas treatment unit 104. System exhaust gas treatment unit 114 includes components for removing unwanted materials from exhaust gases that originate from tools in the fabrication facility 100, in addition to the wet bench 102. For example, system exhaust gas treatment unit 114 can include a wet scrubbing unit for removing unwanted materials from exhaust gases fed to system exhaust gas treatment unit 114. In accordance with embodiments of the present disclosure, system exhaust treatment unit 114 is capable of removing 50% or more of acid or alkaline components in the exhaust gas treated in the system exhaust gas treatment unit 114. In contrast, system exhaust treatment unit 114 is capable of removing only trace amounts of VOC in the exhaust gas treated in the system exhaust gas treatment unit 114. Exhaust gases which have been processed in system exhaust gas treatment unit 114 are exhausted to the environment. System exhaust gas system 112 also includes components for providing makeup air to the semiconductor processing facility 100. For example, in the embodiment illustrated in FIG. 1, system gas treatment system 112 includes an ambient air filtration unit 116 above the 4$^{th}$ floor. Ambient air filtration unit 116 includes filters, e.g., bag filters for removing impurities from the ambient air. Air processed in ambient air filtration unit 116 is delivered to a makeup air handling unit 118 located on the 4$^{th}$ floor which includes a plurality of additional filtration unit operations, e.g., air washer, chemical filter and the like. These additional filtration unit operations serve to further purify the ambient air to standards which render the ambient air suitable as makeup air within the semiconductor processing facility 100. System exhaust gas system 112 can further include dry cooling coils 120 for cooling and makeup air that is to be distributed to other portions of the semiconductor processing facility 100, e.g., a clean room 122. Clean room 122 can also be supplied with makeup air via fan filtration units 124 and can include additional filters, such as filter 126.

In operation of wet bench 102, it has been observed that when a switch box damper within the wet bench 102 switches to direct exhaust gas containing acid components and/or alkaline components, e.g., exhaust gas containing acid or alkaline components, toward the combined exhaust gas treatment unit 104, residual volatile organic compounds that remain in the wet bench tool or that remain in line 108 are drawn into line 110 and delivered to combined exhaust gas treatment unit 104. If exhaust gas treatment unit 104 or components of the system exhaust treatment system 112 are unable to reduce the amount of VOC in the combined exhaust gas delivered to the combined exhaust gas treatment unit 104, undesirable amounts of VOC can be exhausted to the environment or into the general environment of the fabrication facility where the VOC can become entrained in makeup air that is delivered back into the fabrication facility or result in a release of an unwanted amount of VOC to the environment. When such unwanted VOC are entrained in the makeup air which is then delivered back into the fabrication facility or delivered directly back into the fabrication facility, the unwanted VOC can negatively affect the production of semiconductor devices by the fabrication facility.

In accordance with embodiments of the present disclosure, the combined exhaust gas treatment unit 104 can process/treat exhaust gases containing VOC components and acidic or alkaline materials, such as ammonia, hydrofluoric acid, sulfuric acid or nitric acid and reduce the amount of VOC components and the acidic or alkaline components to acceptable levels, e.g., reducing the amount of the VOC components in the combined exhaust gas by 60%, 70%, 80%, 90% or more than 90% and reducing the amount of acidic or alkaline components in the combined exhaust gas by 60%, 70%, 80%, 90% or more than 90%. In accordance with embodiments of the present disclosure, the degree to which the amount of VOC component in the combined exhaust gas is reduced can be the same as the degree to which the amount of acidic or alkaline components in the combined exhaust gas is reduced or the degrees can be different. As described in more detail below, removal of these materials can be accomplished using a device suitable for wet cleaning a gas stream, e.g., a wet scrubber. In principle, wet scrubbers remove water-soluble gases from a gas stream containing such water-soluble gases. Acidic and alkaline gases can be reduced to low levels by means of chemical absorption with alkaline or acidic washing liquids. The captured gases are removed from the scrubber when the scrubbing liquid is removed from the scrubber.

The operation of wet scrubbers or wet separators relies upon the gases or particles from a gas stream laden with such gases or particles being transferred to the scrubbing liquid. For this purpose, appropriate phase interfaces between the gas and the liquid have to be formed and a relative movement of materials between these two phases must occur. One method to achieve phase interfaces with the most thorough possible mixing of the gas and the liquid consists of dispersing one phase into the other. In other words, for instance, bubble swarms are generated in a liquid or drop clusters are generated in a gas, or else systems are created in which the liquid is present in the form of a more or less dispersed jet. Another fundamental way to bring gas and liquid into contact with each other consists of allowing them to circulate around liquid-wetted elements. The gas to be cleaned can be brought into contact with finely dispersed water drops or with some other washing liquid in a parallel current or in a counter-current.

In accordance with embodiments of the present disclosure, some wet scrubbers have two washing stages that are arranged next to each other and that function on the basis of the counter-current principle. Since the transition of the gas into the liquid phase depends on the effective surface of the liquid, these washing stages are sometimes deployed in the form of packed columns. The packed column is usually configured in the form of a packing of suitable filler material on a perforated sieve tray or else in the form of a so-called structured packing in which large blocks of a structured material are installed in the column. Typically the packing material is wetted with the scrubbing liquid. When the contaminated gas comes into contact with the wetted packing material under appropriate conditions, the unwanted contaminants transfer from the gas phase to the liquid phase.

Figure 2:
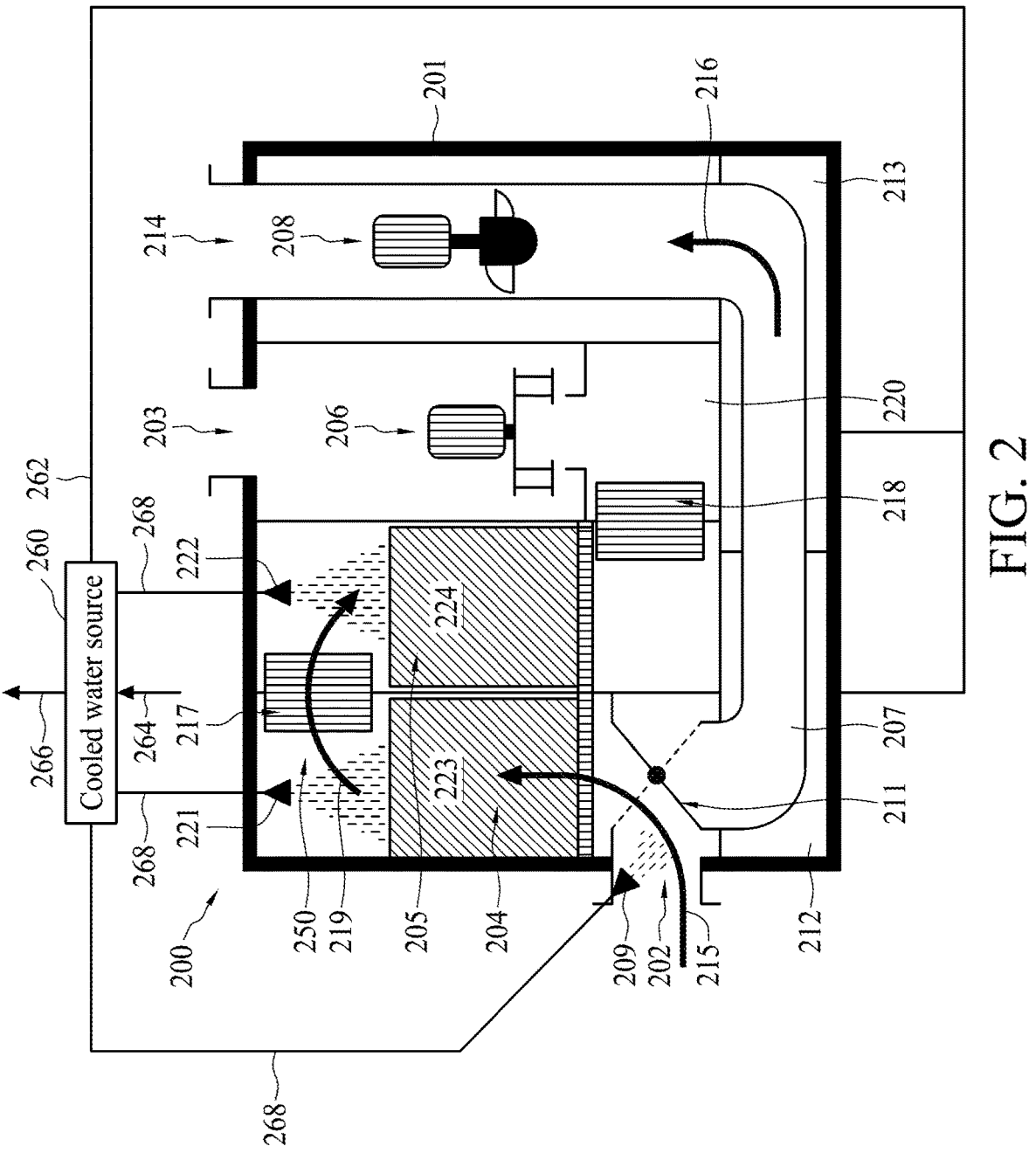
FIG. 2 is a cross-sectional schematic view of an exhaust gas treatment unit, in accordance with some embodiments.

FIG. 2 shows a device 200 for the wet cleaning of a gas stream, e.g., a combined gas exhaust stream from a tool for carrying out a process used in the manufacture of semiconductor devices. For example, systems in accordance with the present disclosure include devices for cleaning exhaust gases from wet-chemical processes, for example, an exhaust from a wet bench utilized in a process to manufacture semiconductor devices. Semiconductor tools typically utilize acidic materials, alkaline materials and VOCs. Volatile organic compounds are compounds that have a high vapor pressure and low water solubility. VOCs are human-made chemicals and include chemicals used in semiconductor manufacturing processes. VOCs are also used in or produced in the manufacture of paints, pharmaceuticals, and refrigerants. VOCs typically are industrial solvents, such as trichloroethylene; fuel oxygenates, such as methyl tert-butyl ether (MTBE); or by-products produced by chlorination in water treatment, such as chloroform. VOCs are often components of petroleum fuels, hydraulic fluids, paint thinners, and dry cleaning agents. VOCs are common ground-water contaminants. Examples of VOCs used in or produced in semiconductor tools include isopropyl alcohol (IPA), xylene, acetone and the like. Some VOC materials when absorbed by other materials, e.g., water, can be converted to unwanted materials. For example, when isopropyl alcohol is utilized in a semiconductor tool, gaseous isopropyl alcohol may be partially absorbed by water and degraded to acetone by oxidants in the water. VOC materials that are removed from tool exhaust gases include degradation products, e.g., acetone, of other VOC materials, e.g., IPA. Examples of alkaline materials used in semiconductor tools include ammonia. Examples of acidic materials used in semiconductor tools include hydrogen fluoride, nitric acid, hydrochloric acid and sulfuric acid. Exhaust gases from semiconductor processing tools need to be cleaned to remove unwanted acid materials, unwanted alkaline materials and/or unwanted VOCs. An example of a device 200 for wet cleaning combined exhaust gases from a semiconductor processing tool is a wet scrubber. In accordance with embodiments of the present disclosure, the combined exhaust gas that is to be cleaned includes an acid component and a VOC component (e.g., IPA and acetone), an alkaline component and a VOC component (e.g., IPA and acetone) or an acid component, and alkaline component and a VOC component (e.g., IPA and acetone). The combined exhaust gas to be cleaned is fed into a cleaning segment of device 200 via a gas inlet 202 arranged in a housing 201 of the device 200 so that the unwanted materials present in the combined exhaust gas can be removed through chemical absorption by liquid flowing in the device 200. The device 200 includes a gas outlet 203 through which cleaned gas exits device 200. In the embodiment illustrated in FIG. 2, the combined gas stream entering inlet 202 can first be processed in a pre-scrubber and pre-washed with a fluid such as water by means of spray nozzle 209. As described in more detail below, fluid for pre-scrubbing or pre-washing the combined gas stream entering inlet 202 is provided to spray nozzles 209 from a cooled water source 260.

Figure 3:
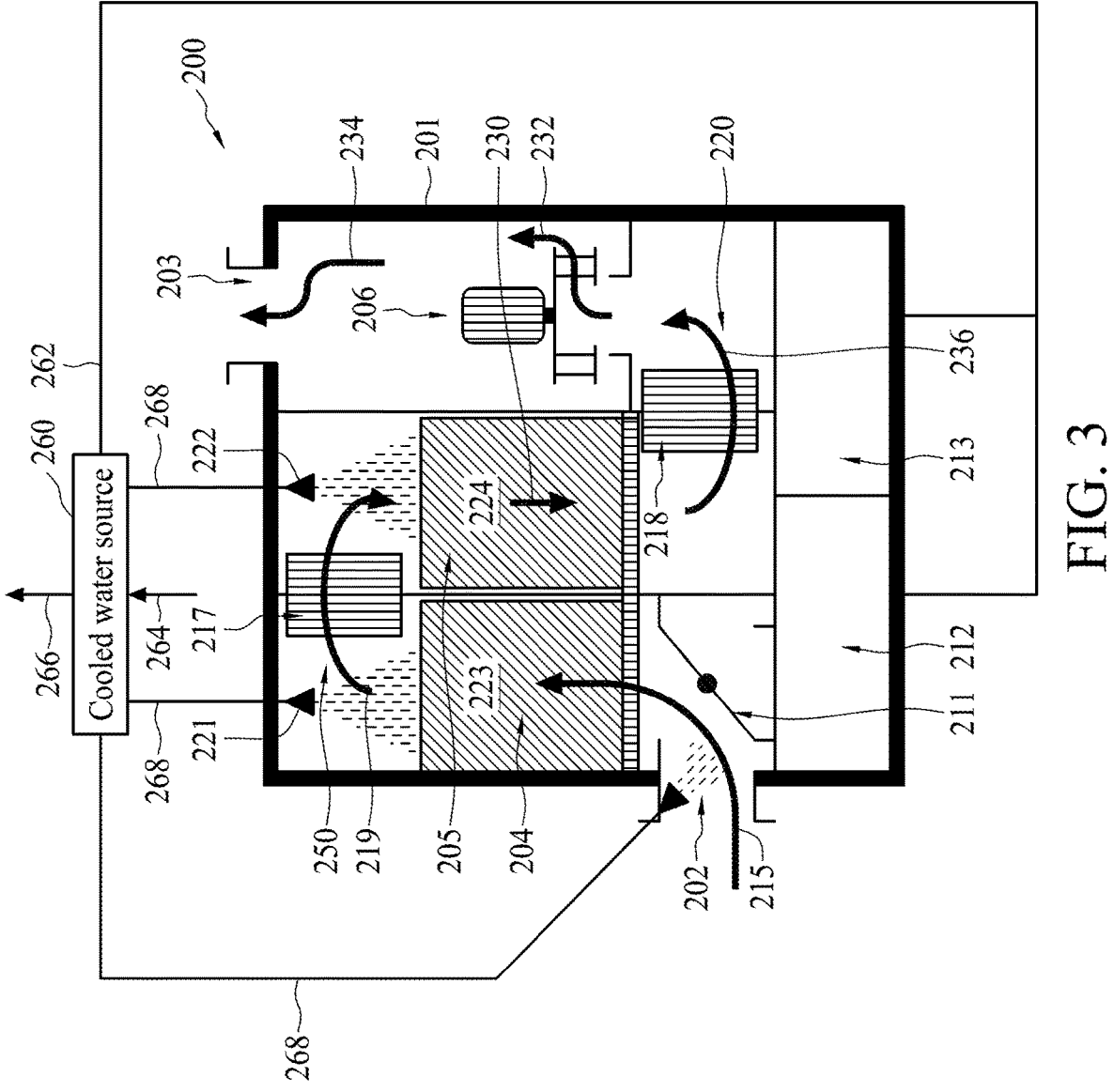
FIG. 3 is a cross-sectional schematic view of an exhaust gas treatment unit, in accordance with some embodiments.

Exhaust gas that enters inlet 202 is diverted by baffle 211 into a first washing segment or impurity scrubbing unit 204 arranged in the flow path of the gas stream 215. In the embodiment of FIGS. 2 and 3, the first washing segment 204 includes a filler or material packing 223, e.g., in a packed column. The gas stream 215 flows up through the washing segment 204 from the bottom to the top. The washing segment 204 is supplied with a first washing liquid via additional spray nozzles 221 installed above the filler material packing 223. As described in more detail below, first washing liquid is provided to spray nozzles 221 from a cooled water source 260. Spray nozzles 221 are part of a dispenser section that forms a part of the impurity scrubbing unit 204.

As shown in FIG. 2, first washing liquid trickles through the filler material packing 223 from the top to the bottom. The filler material packing 223 can be implemented in the form of a non-random packing material. Non-random packing material or structured packing material is to be distinguished from random packing material. Random packing material is characterized by a random distribution of small packing materials which assist in the separation process. In contrast, non-random or structured packing material uses larger, fixed packing structures. Some types of non-random or structured packing materials guide liquid materials through complex structural channels formed into a specific, fixed shape. Examples of random packing materials include raschig rings, pall rings, saddle rings, lessing rings and tri-pack rings. Random packing materials are not limited to these types of rings. There are other random packing materials in addition to those expressly listed above. Non-random or structured packing materials utilized in accordance with embodiments of the present disclosure are distinct and different from the random packing materials described above. Non-random or structured packing materials provide organized packing used to channel liquid material into and through a specific shaped structure. Non-random or structured packing materials promote a uniform flow and distribution of scrubbing fluid through the packing which promotes more effective mass transfer of materials from the gas to the scrubbing liquid. In contrast random packing materials promote a non-uniform flow and non-uniform distribution of fluid through the packing material. Examples of structured packing material utilize discs composed of material such as metal, plastic or porcelain with internal structures arranged into different types of honeycomb shapes. These honeycomb shapes are deployed within the columns or cylindrical vessels of the washing units 204 and 205. Examples of non-random or structured packing material include knitted wire structured packing, gauze, corrugated monolithic structured packing with finned inlets, corrugated monolithic structured packing without finned inlets, regular lattice and non-lattice structured packing. Further details of non-random or structured packing materials useful in embodiments of the present disclosure are described below in more detail. The gas stream 215 is fed from below through the first washing segment 204. In this manner, the large surface area of the filler material and the counter-current flow of the exhaust gas 215 and the washing liquid promote absorption by the washing liquid of unwanted materials in the exhaust gas 215.

After the gas stream has flowed through the first washing segment 204, it flows (as indicated by arrow 219 in FIGS. 2 and 3) through a droplet separator or liquid separator 217 that is located downstream from and above the first washing segment 204 in a first deflection area 250 in FIG. 3. Passing the gas stream through droplet separator 217 removes droplets from the gas stream thereby preventing any entrainment of washing liquid in the gas stream.

From the droplet separator 217, the gas stream reaches a second washing segment or second impurity scrubbing unit 205 where it is washed with a washing liquid that is the same as the washing liquid used in first washing segment 204 or a washing liquid that is different from the washing liquid used in first washing segment 204. An example of a suitable washing liquid is water which is generally available as plant water or distilled water. The second washing segment 205 includes a filler material packing 224 or a packed column. The washing liquid of the second washing segment 205 is applied to the filler material packing 224 by spraying the water from spray nozzles 222 located above the filler material packing 224. As described in more detail below, washing liquid is provided to spray nozzles 222 from a cooled water source 260. Spray nozzles 222 form part of a dispenser section that is a component of the impurity scrubbing unit 205. In the embodiment of FIG. 2, the gas stream flows downward through the second washing segment 205 from the top to the bottom in the same direction as the washing liquid.

After the gas stream has flowed through the second washing segment 205, it is fed into a second liquid separator 218 that is located downstream from the second washing segment 205 in a second deflection area 220 in FIG. 3.

In the embodiment of FIG. 2, both washing segments 204 and 205 are arranged one after the other in the flow path of the exhaust gas. The same applies for FIG. 3. Washing segments 204 and 205 are arranged in the housing 201 side by side, with the gas stream flowing in opposite directions. In the illustrated embodiments of FIGS. 2 and 3, the gas stream in the first washing segment 204 flows in an upwards direction, counter-current to the washing liquid and then, in the second washing segment 205, the exhaust gas flows downwards in the same direction as the washing liquid. In this manner, both washing segments 204 and 205 can be installed next to each other in a compact arrangement. In other embodiments, washing segments 204 and 205 can be stacked one on top of the other with the exhaust gas flowing in the same direction through washing segment 204 and washing segment 205.

In FIG. 2, device 200 has at least one fan 206 located downstream of second deflection area 220. Fan 206 helps to regulate the air pressure along the flow path of the gas stream inside the housing 201 of the device 200. In this manner, the pressure within housing 201 can be regulated and kept constant. Regulation of the speed of fan 206 can achieve a pressure stability of + or −10 Pa during the gas cleaning process. Fan 206 can be a radial fan, in which, the inlet can be at the bottom and the outlet can be at the top, in other words, along a single axis. In this orientation, the gas stream is conveyed from below centrally onto the horizontal impeller through an opening in the baseplate on which the fan is mounted. The impeller accelerates the gas away from the axis towards the outside, from where it is discharged upwards. The drive of the fan is arranged centrally in the flow channel and is surrounded by the gas stream.

In the embodiment of FIG. 2, device 200 includes a bypass channel 207 for bypassing the flow of exhaust gas (e.g., path 215) through the washing segments 204 and 205. In the embodiment of FIG. 2, bypass channel 207 runs below the washing segments 204 and 205. A regulator 208 is located near the end of bypass channel 207. Regulator 208 promotes discharge of the gas stream that is conveyed to it via the bypass channel 207. The gas stream flowing along the flow path 216 (in FIGS. 2 and 4) in bypass channel 207 is discharged from the device 200 through the gas outlet 214 of the bypass channel 207. In some embodiments, the regulator 208 can include an automatically adjustable throttle valve or can be a pump or fan. The regulator 208 serves to promote the discharge of the gas stream that is conveyed to it via the bypass channel 207. Due to the bypass channel 207, the pressure on the gas inlet side 202 can be maintained, even, for example, during maintenance work or in the case of a failure of the device 200. Thus, the flow back of impurities to process equipment upstream of device 200 caused by a shutdown of device 200 can be avoided. In the case of maintenance work or a malfunction, the gas stream can bypass the two washing segments 204 and 205 via the bypass channel 207.

In FIG. 2, a baffle element 211 is provided at gas inlet 202 for switching the gas flow over between a flow path (216 in FIG. 4) of the gas stream through the bypass channel 207 and the flow path (215 in FIGS. 2 and 3) through the at least one washing segment 204. Baffle element 211 can be moved by means of a drive (not shown here) between a bypass position and a position for directing the gas stream to washing segments 204 and 205. FIG. 2 shows the baffle element 211 with a solid line in a position in which the gas stream is being conveyed through the washing segments 204 and 205. The dash-dot line of the baffle element 211 in FIG. 2 illustrates the bypass channel position of the baffle element 211 which causes the gas stream to be directed into bypass channel 207. Baffle element 211 is configured so that, irrespective of its position, it directs the washing liquid from the first washing segment 204 into a collection tank 212. Furthermore, a second collection tank 213 is provided for the second washing liquid from second washing segment 205. In other embodiments, the first and second washing liquids can be fed into a single collection tank.

The arrows 215, 219, 230, 236, 232 and 234 in FIG. 3 show the flow path of the gas stream through the washing segments 204 and 205, droplet separator 217, second deflection area 220 and fan 206. The baffle element 211 is in a position in which the gas stream that is flowing into the gas inlet 202 is conveyed into the first washing segment 204. As already elaborated upon above, the gas stream then flows through the liquid separator 217 situated in the first deflection area 250 and enters the second washing segment 205. Subsequently, the gas stream flows through the second liquid separator 218 and is discharged from the device 200 via the fan 206 through the gas outlet 203.

The bypass channel 207 is not shown in the depiction of the device 200 in FIG. 3 since it would obstruct the view of the outlet channel with the gas outlet 203 and the two collection tanks 212 and 213.

Figure 4:
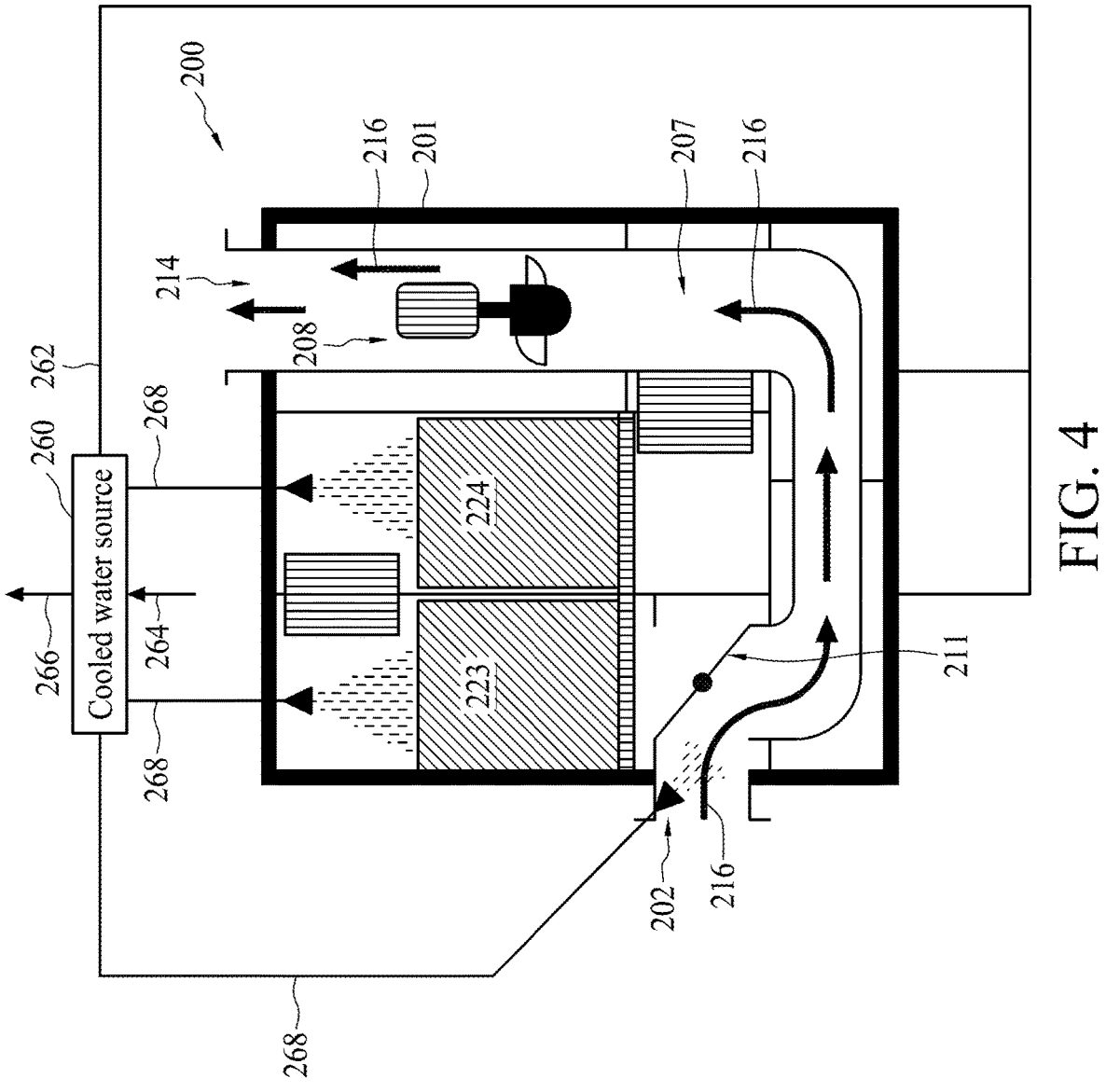
FIG. 4 is a cross-sectional schematic view of an exhaust gas treatment unit, in accordance with some embodiments.

The flow path 216 of the gas stream through the bypass channel 207 is indicated by the arrows 216 in FIG. 4. In this case as well, the gas stream enters the device 200 via the gas inlet 202 and then, depending on the position of the baffle element 211, it is not conveyed into the first washing segment 204 but rather into the bypass channel 207. In other words, the gas stream flows around the washing segments 204 and 205. The gas stream is then discharged from the device 200 via the gas outlet 214 of the bypass channel 207. The regulator 208 supplies the pressure needed to draw the gas stream into the bypass channel 207 and cause it to flow through the bypass channel 207. The collection tanks 212 and 213 of the first washing segment 204 and the second washing segment 205 are not depicted in FIG. 4 because they are obscured by the bypass channel 207.

Examples of non-random or structured packing materials useful in embodiments of the present disclosure exhibit an interfacial surface area of greater than 250 $m^2/m^3$. The pressure drop through examples of non-random or structured packing materials useful in embodiments of the present disclosure ranges from 440 Pa to 660 Pa. Examples of non-random or structured packing materials useful in embodiments of the present disclosure exhibit a max F factor of between 2 and 3. Non-random or structured packing materials useful in embodiments of the present disclosure can be characterized by a gas load factor or F factor (superficial velocity*gas density^0.5). Examples of non-random or structured packing materials useful in embodiments of the present disclosure exhibit a max F factor of between 2 and 3. Examples of non-random or structured packing materials useful in embodiments of the present disclosure exhibit number of transfer units (NTU)/hour of greater than 2 up to 5. Examples of non-random or structured packing materials useful in embodiments of the present disclosure exhibit a max F factor to NTU ratio of greater than 5 to about 10. Examples of non-random or structured packing materials useful in embodiments of the present disclosure exhibit specific volume (1/F×NTU) of less than 0.2 down to 0.1. Examples of non-random or structured packing materials useful in embodiments of the present disclosure exhibit a ratio of specific volume of less than 0.4, e.g., in a range of 0.01 to 0.35. Non-random or structured packing materials useful in embodiments of the present disclosure are not limited to such materials that satisfy the foregoing criteria; for example, non-random or structured packing materials useful in embodiments of the present disclosure can be characterized by interfacial surface areas, F factors, NTU/hour, max F factor to NTU ratios, specific volumes and ratio of specific volume that fall outside the explicit ranges described above. Utilizing non-random or structured packing materials exhibiting properties that fall within the ranges described above promotes satisfactory flow rates of liquid and gas, high gas liquid contact areas which support high mass transfer to remove acid compounds or alkaline compounds and/or VOC components from tool exhaust gases to the levels described herein by with embodiments of the present disclosure, all while enabling a compact size.

Referring to FIGS. 2-4, device 200 for the wet cleaning of an exhaust gas stream in accordance with embodiments of the present disclosure includes thermal energy removal unit or source of cooled fluid 260, e.g., cooled water. Source of cooled fluid 260 receives scrubbing water via line 262 and delivers cooled scrubbing water to nozzles 221 and 222 via lines 268. In the embodiment illustrated in FIGS. 1-4, the scrubbing water provided via line 262 is drawn from collection tank 212 or collection tank 213 and constitutes scrubbing water that has previously contacted washing units 204 and 205, respectively. In other words, in some embodiments, scrubbing water is recycled from collection tank 212 or collection tank 213. In other embodiments, scrubbing water provided via line 262 can be drawn from other sources of water within the semiconductor processing facility 100. In an embodiment, cooled water source 260 is a heat exchanger with the scrubbing water from line 262 passing through one side of the heat exchanger. An example of a suitable heat exchanger is a compact type heat exchanger that includes an interfacial area of greater than 500 m$^2$/m$^3$ and is easy to integrate inside a housing of wet scrubber unit to save installation space. The other side of the heat exchanger receives coolant via line 264. The coolant receives thermal energy from the scrubbing water and exits the heat exchanger via line 266. Coolant in line 266 can be delivered to a refrigeration unit (not shown) where the temperature of the coolant is lowered before it is returned to the cooled water source 260 via line 264. In the source of cooled fluid 260, the temperature of the scrubbing water is reduced. In some embodiments in accordance with the present disclosure, the temperature of the scrubbing water is reduced by 9° C. or more. In other embodiments, the temperature of the scrubbing water is reduced by 10° C. or more. In some embodiments, the temperature of the scrubbing water entering the source of cooled fluid 260 is in the range of 15 to 20 degrees Celsius, e.g., 17 degrees Celsius. In some embodiments, the temperature of the scrubbing water exiting the source of cooled fluid 260 is in the range of 5 to 10 degrees Celsius, e.g., 7-9 degrees Celsius. The temperature of the coolant entering source of cooled fluid 260 can vary depending upon the amount of thermal energy to be removed from the scrubbing water, the surface area of the heat exchanger and the flow rate of the scrubbing water and the coolant. In some embodiments, the temperature of the coolant entering source of cooled fluid 260 is in the range of 3 to 10 degrees Celsius, e.g., 5 degrees Celsius. In some embodiments, the temperature of the coolant exiting source of cooled fluid 260 is in the range of 10-15 degrees Celsius, e.g., 12 degrees Celsius. It has been observed that when the scrubbing water temperature is reduced in the range of 7 to 9° C. in accordance with embodiments of the present disclosure, an 90% or more efficiency in removal of acid components or alkaline components from the tool exhaust gas and an 80% or more efficiency in removal of VOC components from the tool exhaust gas is achieved. In some embodiments of the present disclosure, achieving a 90% or more efficiency and removal of acid components or alkaline components produces an exhaust gas that includes less than 15 ppm of acid or alkaline components. In some embodiments of the present disclosure, achieving an 80% or more efficiency in removal of VOC from the tool exhaust gas produces an exhaust gas that includes less than 10 ppm of VOC. By achieving this level of VOC removal less VOC gases are likely to be exhausted to the general environment or the facility environment. As used herein, percent efficiency in removal of VOC refers to a percent of VOC present in an exhaust gas entering device 200 that is removed in the device 200. Percent efficiency in removing VOC can be determined using the concentration of VOC in exhaust gas entering device 200 and the concentration of VOC in exhaust gas leaving device 200.

In the embodiment described in the previous paragraph, the temperature of the scrubbing fluid is reduced by passing the scrubbing fluid removed from collection tank 212 or collection tank 213 through a heat exchanger. In other embodiments, the scrubbing fluid in collection tank 212 and/or collection tank 213 can be cooled by recirculating scrubbing fluid in collection tank 212 and/or collection tank 213 through a heat exchanger and removing thermal energy from the recirculating scrubbing fluid before the scrubbing fluid is removed from collection tanks 212 or 213 and delivered to dispensing sections 221 or 222. In other embodiments, the collection tanks 212 or 213 can be provided with a cooling coil submerged in the scrubbing fluid present in collection tanks and operating the cooling coil so as to remove thermal energy from the scrubbing fluid while it is in the collection tanks 212 and/or 213.

Figure 5:
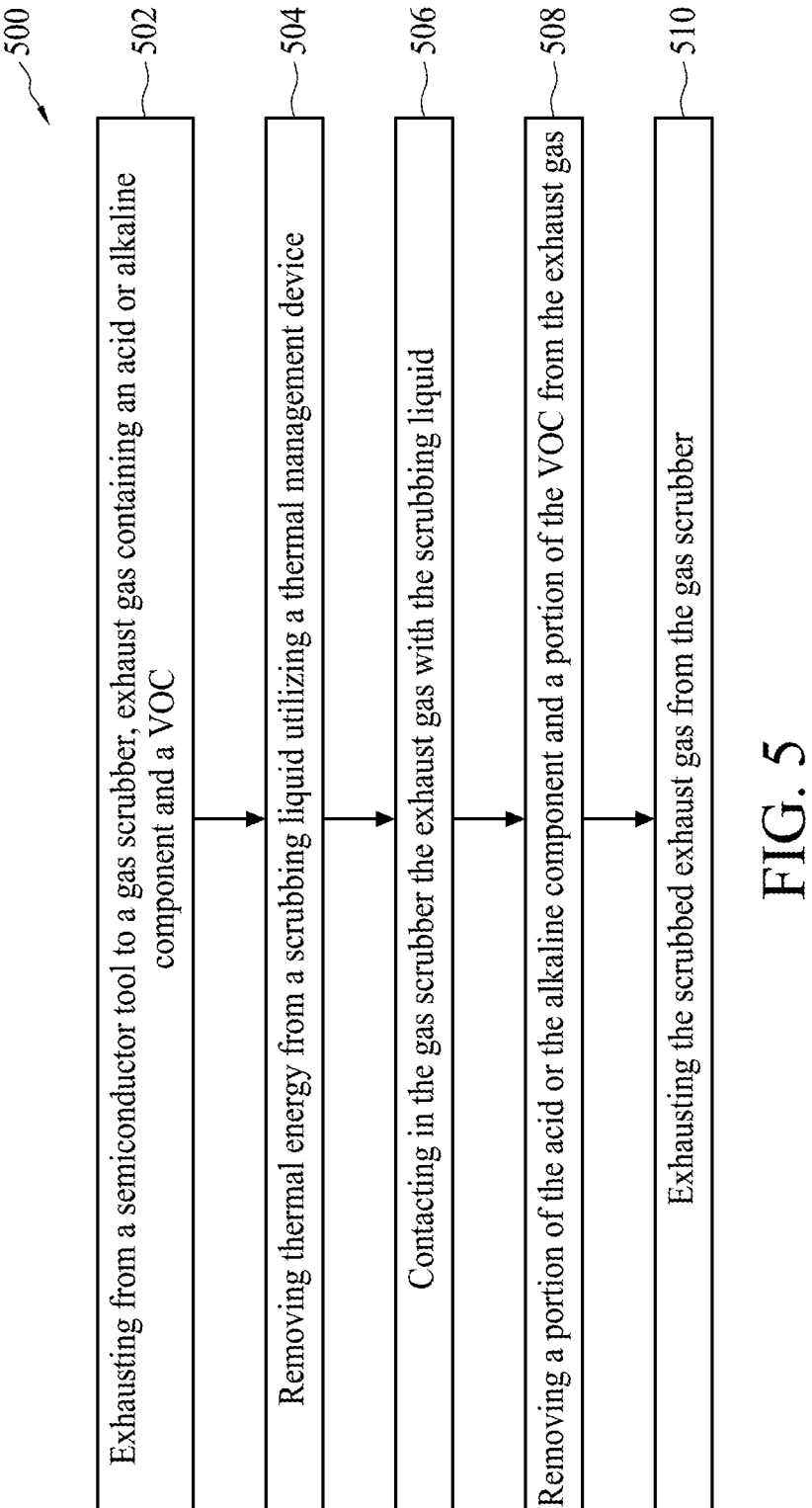
FIG. 5 is a flow diagram of a process for treating exhaust gas from a semiconductor tool, in accordance with some embodiments.

Referring to FIG. 5, an embodiment of the present disclosure includes a method 500 for processing a process gas, e.g., an exhaust gas from a semiconductor tool, e.g., a wet bench or other semiconductor process tool. Method 500 includes operation 502 of exhausting from the semiconductor tool to a combined exhaust gas treatment unit, an exhaust gas containing an acid component or an alkaline component and a volatile organic compound or VOC (e.g., IPA and acetone). Wet bench 102 in FIG. 1 is an example of a semiconductor tool useful in method 500. Gas scrubber 200 is an example of a combined exhaust gas treatment unit useful in method 500. Method 500 includes operation 504 wherein thermal energy is removed from a scrubbing fluid utilizing a thermal management device. Cooled water source 260 is an example of a thermal management device useful in method 500. Method 500 proceeds with operation 506 of contacting combined exhaust gas with the scrubbing fluid in the combined exhaust gas treatment unit. Contact between the exhaust gas and the scrubbing fluid results in acid or alkaline components and VOC components (e.g., IPA and acetone) in the combined exhaust gas transferring to the scrubbing liquid; thereby reducing the concentration of the acid or alkaline components and the VOC components in the combined exhaust gas. Method 500 proceeds with operation 510 of exhausting the treated exhaust gas from the combined exhaust gas treatment unit. In accordance with some embodiments, the treated exhaust gas exhausted from the scrubber 200 is delivered to system exhaust treatment unit 114 where further acid or alkaline components are removed from the treated exhaust gas. In accordance with embodiments of the present disclosure, system exhaust treatment unit 114 is not capable of removing any or only a small amount of VOC from the treated exhaust gas.

In another embodiment of the present disclosure, a method 600 of FIG. 6 is provided. Method 600 is a method of processing exhaust gas from a semiconductor wet bench. The method 600 utilized non-random or structured packing material along with cooled scrubbing fluid to effectively remove 90% or more of acid or alkaline components in a tool exhaust gas along with 80% or more of VOC components in the tool exhaust gas. Method 600 is initiated at operation 602 by introducing a VOC into a wet bench. An example of a suitable wet bench includes wet bench 102 in FIG. 1. At operation 604, a semiconductor process is carried out in the semiconductor wet bench utilizing the VOC. Examples of suitable semiconductor processes carried out in the semiconductor wet bench include development of photoresist, etching, cleaning and drying. Upon completion of operation 604, a VOC containing exhaust gas is exhausted from the wet bench to a VOC exhaust treatment unit at operation 606. An example of a VOC exhaust treatment unit useful in operation 606 includes the VEX 106a in FIG. 1. At operation 608, an alkaline component or an acid component is introduced into the wet bench and at operation 610 a process is carried out in the wet bench utilizing the alkaline or acid component. Operation 610 produces an exhaust gas within the wet bench that includes an acidic or alkaline component. At operation 612 a combined exhaust gas is exhausted from the wet bench to an impurity scrubbing unit or a combined exhaust gas treatment unit. The impurity scrubbing unit receives the combined exhaust gas at operation 614. The combined exhaust gas includes the alkaline or acid component and a portion of the VOC containing exhaust gas that remains in the wet bench after operation 606. An example of an impurity scrubbing unit that receives the combined exhaust gas in operation 614 includes the scrubber 104, 200. At operation 616 thermal energy is removed from a scrubbing liquid for example, by passing the scrubbing liquid through the heat exchanger of cooled water source 260 in FIGS. 2-4. Operation 616 lowers the temperature of the scrubbing liquid as described above. The cooled scrubbing liquid is dispensed from a dispenser section into a packing material section of the impurity scrubbing unit at operation 618. Examples of a dispenser section include the dispenser sections 221, 222 and examples of packing material sections include packing material sections 223, 224. At operation 620, the combined exhaust gases come in contact with the cooled scrubbing liquid in the packing material section and greater than 90% of the acid or alkaline component is removed from the combined exhaust gas along with over 80% of the VOC component from the combined exhaust gas. Method 600 terminates at operation 622 where the treated combined exhaust gases exhausted from combined exhaust gas treatment unit.

One aspect of this description relates to a method of processing a process gas from a semiconductor tool to remove impurities from the process gas. In some embodiments, the process gas is an exhaust gas, containing alkaline or acid components and VOC components, from a semiconductor tool such as a wet bench. The method utilizes cooled scrubbing fluid and structured non-random packing materials to enhance not only the mass transfer of the alkaline or acid components to the scrubbing fluid but also the mass transfer of the VOC component from the exhaust gas to the scrubbing fluid. The method includes exhausting from the semiconductor tool to a gas scrubber, an exhaust gas containing the acid component or the alkaline component and a VOC component. The gas scrubber includes a thermal management device configured to remove thermal energy from a scrubbing fluid to be contacted with the exhaust gas. After thermal energy has been removed from the scrubbing liquid, the scrubbing liquid is contacted with the exhaust gas in the presence of the packing material. A portion of the acid or alkaline component and a portion of the VOC component in the exhaust gas moves to the scrubbing fluid, thereby reducing the concentration of the acid or alkaline component in the exhaust gas and the concentration of the VOC component in the exhaust gas. The resulting treated exhaust gas is then exhausted from the gas scrubber.

Another aspect of this description relates to a method of processing exhaust gas from a semiconductor wet bench. In some embodiments, the process gas is an exhaust gas, containing alkaline or acid components and VOC components. The method utilizes cooled scrubbing fluid and structured non-random packing materials to enhance not only the mass transfer of the alkaline or acid components to the scrubbing fluid but also the mass transfer of the VOC component from the exhaust gas to the scrubbing fluid. The method includes introducing a volatile organic compound into a semiconductor wet bench. The volatile organic compound is utilized to carry out a process on a substrate in the wet bench. Once the process utilizing the volatile organic compound is completed, a VOC containing exhaust gas is exhausted from the wet bench to a VOC exhaust treatment unit. Thereafter an alkaline component or an acid component is introduced into the wet bench. A process utilizing the acid component or the alkaline component is then carried out in the wet bench. Such process produces an exhaust gas that includes volatilized acid component or volatilized alkaline component. This exhaust gas along with a portion of the VOC containing exhaust that was not exhausted to the VOC exhaust treatment unit and remains within the wet bench are exhausted to a tool exhaust treatment unit where this combined exhaust gases are received in an impurity scrubbing unit of a gas scrubber. Such impurity scrubbing unit includes a packing material section including non-random structured packing material and a dispenser section for dispensing scrubbing fluid onto the packing material. Cooled scrubbing fluid is provided by passing the scrubbing fluid through a thermal energy management device which removes thermal energy from the scrubbing fluid. The cooled scrubbing fluid is then dispensed from the dispenser section into the packing material section. In the packing material section, the combined exhaust gases come in contact with the scrubbing liquid. In accordance with embodiments of the present disclosure, greater than 90% of the acid or alkaline component is removed from the combined exhaust gases in the packing material section and greater than 80% of the VOC component in the combined exhaust gases is removed in the packing material section. Treated exhaust gases that exit the packing material section are exhausted from the gas scrubber.

Still another aspect of this description relates to a semiconductor gas treatment system that includes a first gas scrubber that includes an inlet, which in operation, receives an exhaust gas from a semiconductor processing tool, such as a wet bench. The first gas scrubber includes an impurity scrubbing unit that includes a packing material section and a dispenser section. In operation, the scrubbing fluid is dispensed from the dispenser section to the packing material section. The packing material section includes a nonrandom packing material. The system also includes a thermal energy removal unit that includes an outlet in fluid communication with the dispenser section such that cooled scrubbing fluid can be delivered from the thermal energy removal unit to the dispenser section. The thermal energy removal unit includes a contact surface. In operation, one side of the contact surface contacts the scrubbing fluid to be delivered to the dispenser section and the other side of the contact surface contacts a coolant capable of absorbing thermal energy from the scrubbing fluid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of processing a process gas from a semiconductor tool, the method comprising:

receiving a substrate in the semiconductor processing tool;

exposing the substrate to a volatile organic component in the semiconductor processing tool;

carrying out a semiconductor manufacturing process on the substrate using the volatile organic component;

exhausting from the semiconductor tool to a gas scrubber, an exhaust gas containing an acid component or an alkaline component and the volatile organic component;

removing thermal energy from a scrubbing liquid by passing the scrubbing liquid through a thermal management device;

contacting, in the gas scrubber, the exhaust gas with the scrubbing liquid that has passed through the thermal management device in the presence of a structured packing material in the form of corrugated monolithic structured packing with finned inlets;

removing a portion of the acid or the alkaline component and a portion of the volatile organic component (VOC) from the exhaust gas in the gas scrubber; and exhausting the scrubbed exhaust gas from the gas scrubber.

2. The method of claim 1, wherein the removing thermal energy from the scrubbing liquid includes passing the scrubbing liquid through a heat exchanger.

3. The method of claim 1, wherein the removing the portion of the VOC from the exhaust gas in the gas scrubber includes reducing the VOC content of the exhaust gas in the gas scrubber to less than 10 ppm.

4. The method of claim 1, further comprising:

delivering the exhaust gas from the gas scrubber to a system exhaust treatment unit;

treating the exhaust gas in the system exhaust treatment unit; and exhausting from the system exhaust treatment unit, the exhaust gas treated in the system exhaust treatment unit.

5. A method of processing exhaust gas from a semiconductor wet bench, the method comprising:

introducing a volatile organic component (VOC) into a semiconductor wet bench;

carrying out a process in the semiconductor wet bench utilizing the VOC;

exhausting, from the semiconductor wet bench to a VOC exhaust treatment unit, a VOC-containing exhaust gas that includes a portion of the VOC or a degradation product of the VOC;

introducing an alkaline component or an acidic component into the semiconductor wet bench;

carrying out a process in the wet bench utilizing the acidic component or the alkaline component that results in an exhaust gas including the acidic component or the alkaline component;

exhausting from the semiconductor wet bench to a tool exhaust treatment unit, a combined exhaust gas that includes the exhaust gas and a portion of the VOC-containing exhaust gas remaining in the wet bench after the exhausting the VOC-containing exhaust gas, from the semiconductor wet bench to a VOC exhaust treatment unit;

receiving in an impurity scrubbing unit of a gas scrubber, the combined exhaust gas, the impurity scrubbing unit including a packing material section and a dispenser section;

removing thermal energy from a scrubbing liquid;

dispensing the scrubbing liquid from the dispenser section into the packing material section;

contacting the combined exhaust gas with the scrubbing liquid in the packing material section and removing from the combined exhaust gas, greater than 90% of the acidic component or the alkaline component contained in the combined exhaust gas and removing, from the combined exhaust gas, greater than 70% of the volatile organic component or degradation product of the volatile organic component in the combined exhaust gas, wherein the packing material section comprises a structured packing material in the form of corrugated monolithic structured packing with finned inlets; and exhausting, from the gas scrubber, a treated exhaust gas.

6. The method of claim 5, wherein the acidic component is sulfuric acid and the alkaline component is ammonia.

7. The method of claim 5, wherein the VOC is isopropyl alcohol or acetone.

8. The method of claim 5, wherein the removing thermal energy from the scrubbing liquid includes recirculating scrubbing liquid collected in a collection tank of the gas scrubber through a heat exchanger to reduce the temperature of the scrubbing liquid in the collection tank.

9. The method of claim 5, wherein the receiving the combined exhaust gas in the impurity scrubbing unit of the gas scrubber includes receiving the combined exhaust gas into an impurity scrubbing unit of the gas scrubber that includes a packing material section including a structured packing material having an interfacial area of greater than $250 \text{ m}^2/\text{m}^3$.

10. A method, comprising:

delivering an exhaust gas from a semiconductor processing tool into a gas scrubber, wherein the exhaust gas comprises an acid component, an alkaline component, a volatile organic component or combinations thereof;

flowing the exhaust gas upwards through a first washing segment comprising a first packing material in a first direction;

contacting a first washing liquid with the exhaust gas in the first washing segment as the first washing liquid flows downwards through the first washing segment in a second direction opposite the first direction;

flowing the exhaust gas through a second washing segment comprising a second packing material downstream the first washing segment in the first or the second direction; and contacting a second washing liquid with the exhaust gas in the second washing segment as the second washing liquid flows downwards through the second washing segment in the second direction, wherein the first washing liquid and the second washing liquid independently have a temperature ranging from 5 to 10° C., and wherein the first washing segment comprises a first structured packing material and the second washing segment comprises a second structured packing material, the first and second structured packing materials in the form of corrugated monolithic structured packing with finned inlets.

11. The method of claim 10, wherein the exhaust gas flows downwards through the second washing segment in the same direction as the second washing liquid.

12. The method of claim 10, wherein the exhaust gas flows upwards through the second washing segment in the opposite direction as the second washing liquid.

13. The method of claim 10, further comprising supplying the first washing liquid to the first washing segment by spraying the first washing liquid from a first spray nozzle, and supplying the second washing liquid to the second washing segment by spraying the second washing liquid from a second spray nozzle.

14. The method of claim 10, further comprising providing the first washing liquid and the second washing liquid from a cooled water source, wherein a temperature of a source washing liquid from which the first washing liquid and the second washing liquid are derived is reduced by at least 9° C.

15. The method of claim 10, further comprising passing the exhaust gas through a droplet separator to remove droplets from the exhaust gas after the exhaust gas exits the first washing segment.

16. The method of claim 10, further comprising collecting the first washing liquid by a first collection tank after the first washing liquid exits the first washing segment, and collecting the second washing liquid by a second collection tank after the second washing liquid exits the second washing segment.

17. The method of claim 1, wherein a pressure drop through the structured packing material ranges from 440 Pa to 660 Pa.

18. The method of claim 1, wherein the structured packing material exhibits a number of transfer units (NTU)/hour of greater than 2 up to 5.

19. The method of claim 10, wherein the first and second structured packing materials exhibit a max F factor to NTU ratio of greater than 5 to about 10.

20. The method of claim 10, wherein the first and second structured packing materials exhibit a specific volume (1/F× NTU) of less than 0.2 down to 0.1.

* * * * *